(12) United States Patent
Zehavi et al.

(10) Patent No.: US 6,196,211 B1
(45) Date of Patent: Mar. 6, 2001

(54) SUPPORT MEMBERS FOR WAFER PROCESSING FIXTURES

(75) Inventors: Raanan Zehavi; Robert Davis, both of Livermore, CA (US)

(73) Assignee: Integrated Materials, Inc., San Jose, CA (US)

( * ) Notice: Subject to any disclaimer, the term of this patent is extended or adjusted under 35 U.S.C. 154(b) by 0 days.

(21) Appl. No.: 09/292,495

(22) Filed: Apr. 15, 1999

(51) Int. Cl.⁷ .................................................. B28D 1/02
(52) U.S. Cl. ................................ 125/12; 125/12; 125/15; 248/178.1
(58) Field of Search .................... 125/12, 15; 248/178.1, 248/277.1, 126.3; 211/41.18, 41.16; 29/557, 558

(56) References Cited

U.S. PATENT DOCUMENTS

| | | |
|---|---|---|
| D. 404,371 | 1/1999 | Shimazu . |
| D. 411,176 * | 6/1999 | Shimazu ............... D13/182 |
| 4,318,749 | 3/1982 | Mayer . |
| 4,566,839 * | 1/1986 | Butler .................... 414/404 |
| 4,872,554 * | 10/1989 | Quernemoen .......... 206/454 |
| 4,914,269 | 4/1990 | Kinsman et al. . |
| 4,966,549 * | 10/1990 | Ohdate .................... 432/253 |
| 5,020,476 | 6/1991 | Bay et al. . |
| 5,468,297 * | 11/1995 | Letort ..................... 118/728 |
| 5,492,229 * | 1/1997 | Tanaka et al. .......... 211/41 |
| 5,534,074 * | 7/1996 | Koons ..................... 118/728 |
| 5,586,880 | 12/1996 | Ohsawa . |
| 5,595,604 * | 1/1997 | Kobayashi et al. ..... 118/15 |
| 5,658,103 | 8/1997 | Inokuchi et al. . |
| 5,752,609 * | 5/1998 | Kato et al. ............. 211/41.18 |
| 5,779,797 | 7/1998 | Kitano . |
| 5,820,683 * | 10/1998 | Ishii et al. .............. 118/728 |
| 5,858,103 * | 1/1999 | Nakajima et al. ...... 118/728 |
| 5,921,229 | 1/1999 | Lee . |
| 5,921,773 * | 7/1999 | Lee ....................... 432/258 |
| 5,931,666 | 8/1999 | Hengst . |

FOREIGN PATENT DOCUMENTS

| | | |
|---|---|---|
| 0506052A1 | 9/1992 | (EP) . |
| 0793260A1 | 9/1997 | (EP) . |
| 00/21119 | 4/2000 | (WO) . |

\* cited by examiner

*Primary Examiner*—David A. Scherbel
*Assistant Examiner*—George Nguyen
(74) *Attorney, Agent, or Firm*—Charles S. Guenzer; Patrick N. Burkhart

(57) ABSTRACT

A method of fabricating support members for wafer processing fixtures is disclosed. In the first step of the method, an elongate support member basic form is provided. The basic form has a substantially wedge-shaped cross-section and angular edges. Next, the edges of the support member basic form are machined to replace the angular edges with substantially arcuate edges. A plurality of wafer-retaining slots are cut along one side of the support member basic form. The support member basic form can include a front surface and a rear surface, with at least one angular edge occurring on each of the surfaces. The step of machining the edges of the support member basic form can be performed as machining the edges on the respective surfaces to radii of between 0.25" and 5.25". In an embodiment, the at least one angular edge occurring on the rear surface can be machined to a radius of approximately 1.5", and the at least one angular edge occurring on the front surface can be machined to a radius of approximately 0.35". At least one attachment structure can be provided on at least one terminal end of the support member basic form. In an embodiment, the attachment structure can be provided as a pair of cylindrical pegs, each of which extends from a respective terminal end of the support member basic form. The elongate support member basic form can be fabricated from an inert crystalline material, such as polycrystalline silicon or monocrystalline silicon. A support member for wafer processing fixtures is also disclosed. The support member can include an elongate body portion having a pair of opposite terminal ends, an arcuate front surface with a first radius of curvature, and an arcuate rear surface with a second radius of curvature. The first radius of curvature can be substantially smaller than the second radius of curvature. A plurality of mutually parallel wafer-retaining slots are formed in the front surface of the body portion.

31 Claims, 2 Drawing Sheets

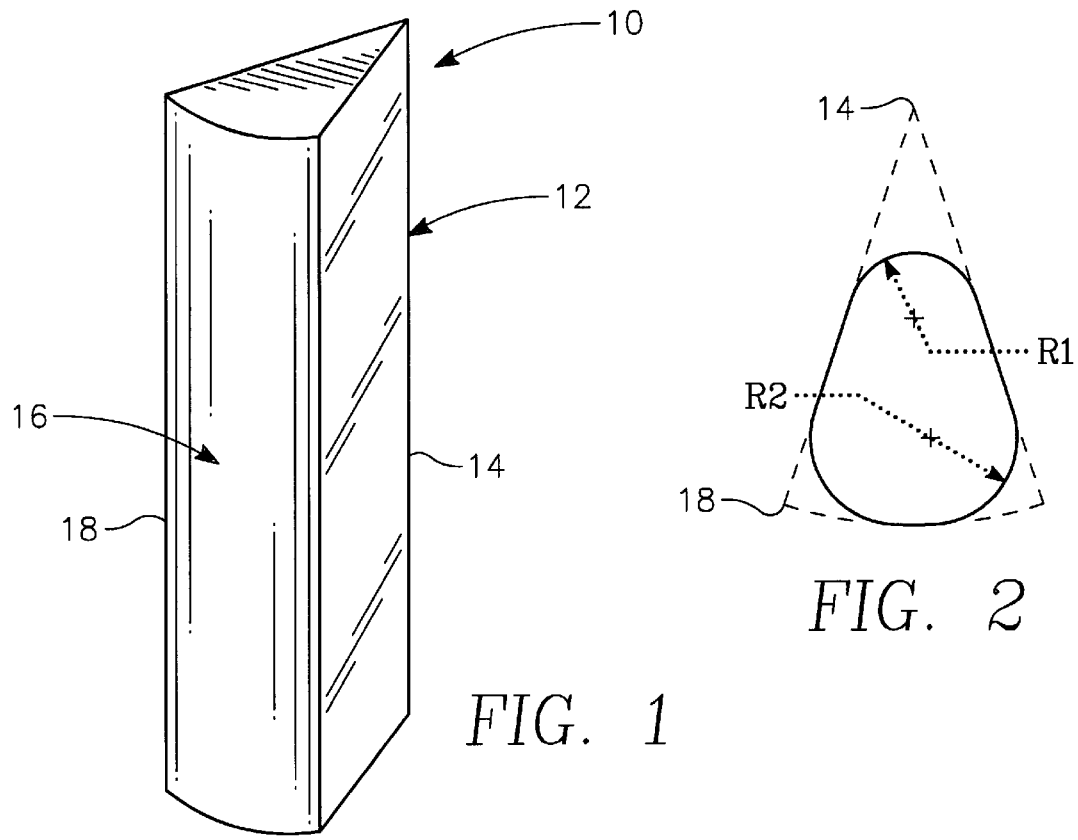
FIG. 1
FIG. 2
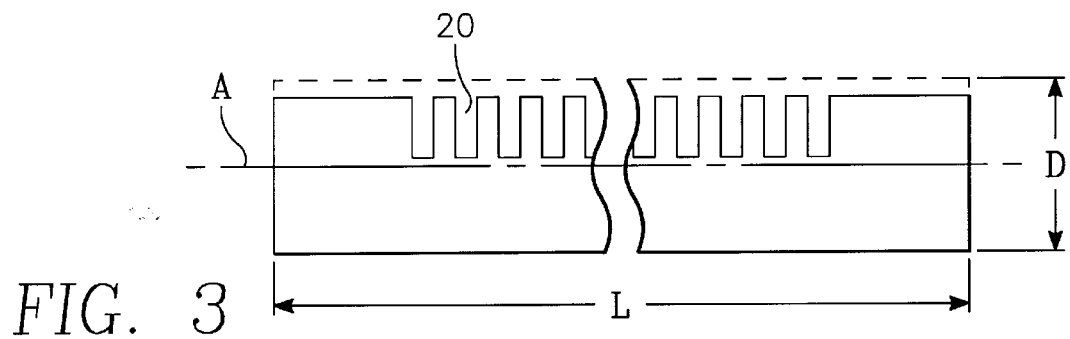
FIG. 3
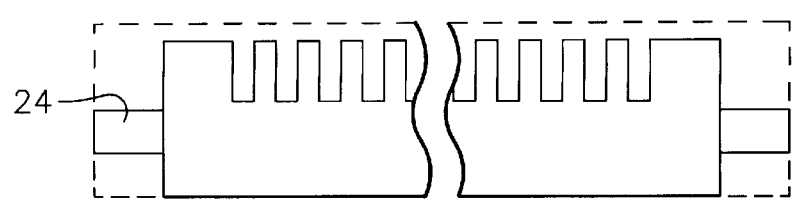
FIG. 4

SUPPORT MEMBERS FOR WAFER PROCESSING FIXTURES

CROSS-REFERENCE TO RELATED APPLICATIONS

This application is related to U.S. Ser. No. 09/292,491 and U.S. Ser. No. 09/292,496, filed of even date herewith, the specifications of which are incorporated by reference herein.

FIELD OF THE INVENTION

The present invention relates generally to support members for wafer processing fixtures. Specifically, the present invention relates to elongate support members for wafer processing fixtures and methods for the manufacture thereof.

BACKGROUND OF THE INVENTION

In the evolution of commercial fabrication of semiconductor wafers, larger and larger wafers are processed in bigger and bigger batches. Such processing has pushed the performance envelope of processing equipment, as well as that of the wafer handling and carrying mechanisms needed to move, transport, and retain the wafers during processing.

In many chemical and thermal processing operations, it is often necessary to hold the wafers in precise positions during various processing steps. Relatively large and complex structures such as "boats" or "towers" are typically employed to that end. One example of such a structure is described in U.S. Pat. No. 5,492,229 to Tanaka et al. The Tanaka et al. patent is directed to a vertical boat for holding a plurality of semiconductor wafers. The boat includes two end members and a plurality of support members. In one embodiment, the support members are formed from pipe members cut vertically to provide a long plate member having a cross section of a quarter-circlular arc. In another embodiment, the support members are formed from pipe members cut vertically to provide a long plate member having a cross section of a semicircular arc. The Tanaka et al. patent lists as potential materials for its boats the following: silica glass, silicon carbide, carbon, monocrystal silicon, polycrystal silicon, and silicon carbide impregnated with silicon. The various components are to be welded together if made from silica glass; otherwise, "they may be assembled in a predetermined manner".

U.S. Pat. No. 5,534,074 to Koons is directed to a vertical boat for holding semiconductor wafers. The boat includes a plurality of rods having slots cut along their lengths. The configuration of the slots is intended to reduce shadowing on wafers placed within the boat during processing. The rods are cylindrical, and are specified as being made from fused quartz, although "any known material suitable for holding wafers may be used."

U.S. Pat. No. 4,872,554 to Quernemoen shows a reinforced carrier for silicon wafers and the like. The carrier includes side components consisting of tubular rails with wafer spacing and supporting teeth projecting therefrom. The rails are made from plastic, and may be provided with rigid inserts for stiffening purposes. The teeth can be integrally molded with, or fused to, the rails.

U.S. Pat. No. 5,752,609 to Kato et al. is directed to a wafer boat including a plurality of rods arranged to support ring members. A plurality of wafer supporting pieces are associated with the ring members, and include angular projections for contacting the wafers. The Kato et al. patent also illustrates a wafer boat including a plurality of cylindrical quartz rods having wafer support recesses formed therein.

The theoretical advantages provided by pure silicon structures are well known. Conventional towers and boats are typically made from quartz or silicon carbide, which introduce contamination and become unstable at higher temperatures. By fabricating wafer holding structures from the same materials as the wafers themselves, the possibility of contamination and deformation would be minimized. The structure would react to processing temperatures, conditions, and chemistry in exactly the same way that the wafers would, thus greatly enhancing the overall effective useful life of the structure.

Unfortunately, standard assembly of silicon structures in a "predetermined manner" as set forth in Tanaka et al. is one of the reasons that pure silicon has not gained wide acceptance as a material for structures such as boats and towers. The difficulties of working with monocrystalline and polycrystalline silicon have led to the development of structures such as that shown in Tanaka et al., wherein, when considering monocrystalline silicon as the material of choice, the connections between the support members and the end members are not described at all, and the only specifically described method of fabricating support structures involves cutting extruded tubular members. Such support structures are inherently less stable than those made from more traditional and easily-worked materials such as quartz or silicon carbide.

Similarly, the patents to Koons, Quernemoen, and Kato et al. fail to address the specific problems of providing a strong, reliable wafer support structure that reduces shadowing and contamination. The projections and slots described in these patents, while effective to some extent, are either not suited for fabrication from materials such as silicon, or require a relatively large cross-sectional area to provide stable and precise wafer support.

Silicon is perceived as being extremely fragile and difficult to weld. Due to these perceptions, known silicon structures are widely believed to be delicate at best, and unreliably flimsy at worst. Consequently, they have failed to receive broad commercial acceptance.

It can thus be seen that the need exists for a strong, reliable support member for wafer processing fixtures that will reduce shadowing and contamination while providing stable and precise wafer support.

SUMMARY OF THE INVENTION

A method of fabricating support members for wafer processing fixtures is disclosed. In the first step of the method, an elongate support member basic form is provided. The basic form has a substantially wedge-shaped cross-section and angular edges. Next, the edges of the support member basic form are machined to replace the angular edges with substantially arcuate edges. A plurality of wafer-retaining slots are cut along one side of the support member basic form.

The support member basic form can include a front surface and a rear surface, with at least one angular edge occurring on each of the surfaces. The step of machining the edges of the support member basic form can be performed as machining the edges on the respective surfaces to radii of between 0.25" and 5.25". In an embodiment, the at least one angular edge occurring on the rear surface can be machined to a radius of approximately 1.5", and the at least one angular edge occurring on the front surface can be machined to a radius of approximately 0.35".

At least one attachment structure can be provided on at least one terminal end of the support member basic form.

The attachment member is adapted and constructed to facilitate attachment of the support member to a generally planar base member. In an embodiment, the attachment structure can be provided as a pair of cylindrical pegs, each of which extends from a respective terminal end of the support member basic form.

The elongate support member basic form can be fabricated from an inert crystalline material, such as polycrystalline silicon or monocrystalline silicon.

The step of cutting a plurality of wafer-retaining slots along one side of the support member basic form can be performed such that a plurality of cuts are made substantially perpendicular to the longitudinal axis of the support member basic form. The cuts can extend a suitable distance through the depth of the support member basic form, and can be made with a rotary saw with a blade having diamond-coated cutting surfaces. The wafer-retaining slots can be formed perpendicular to the front surface of the support member basic form.

A support member for wafer processing fixtures is also disclosed. The support member can include an elongate body portion having a pair of opposite terminal ends, an arcuate front surface with a first radius of curvature, and an arcuate rear surface with a second radius of curvature. The first radius of curvature can be substantially smaller than the second radius of curvature. A plurality of mutually parallel wafer-retaining slots are formed in the front surface of the body portion.

In an embodiment, the first radius of curvature is approximately 0.35", and the second radius of curvature is approximately 1.5". A pair of attachment structures can extend from respective terminal ends of the support member.

DESCRIPTION OF THE DRAWINGS

FIG. 1 illustrates a support member basic form for use with the method of the present invention.

FIG. 2 illustrates an end elevational view of a support member basic form at a first stage of the manufacturing process.

FIG. 3 illustrates a side elevational view of a support member basic form at a subsequent stage of the manufacturing process.

FIG. 4 illustrates a side elevational view of a support member basic form at another stage of the manufacturing process.

DETAILED DESCRIPTION OF THE INVENTION

Figure 5:
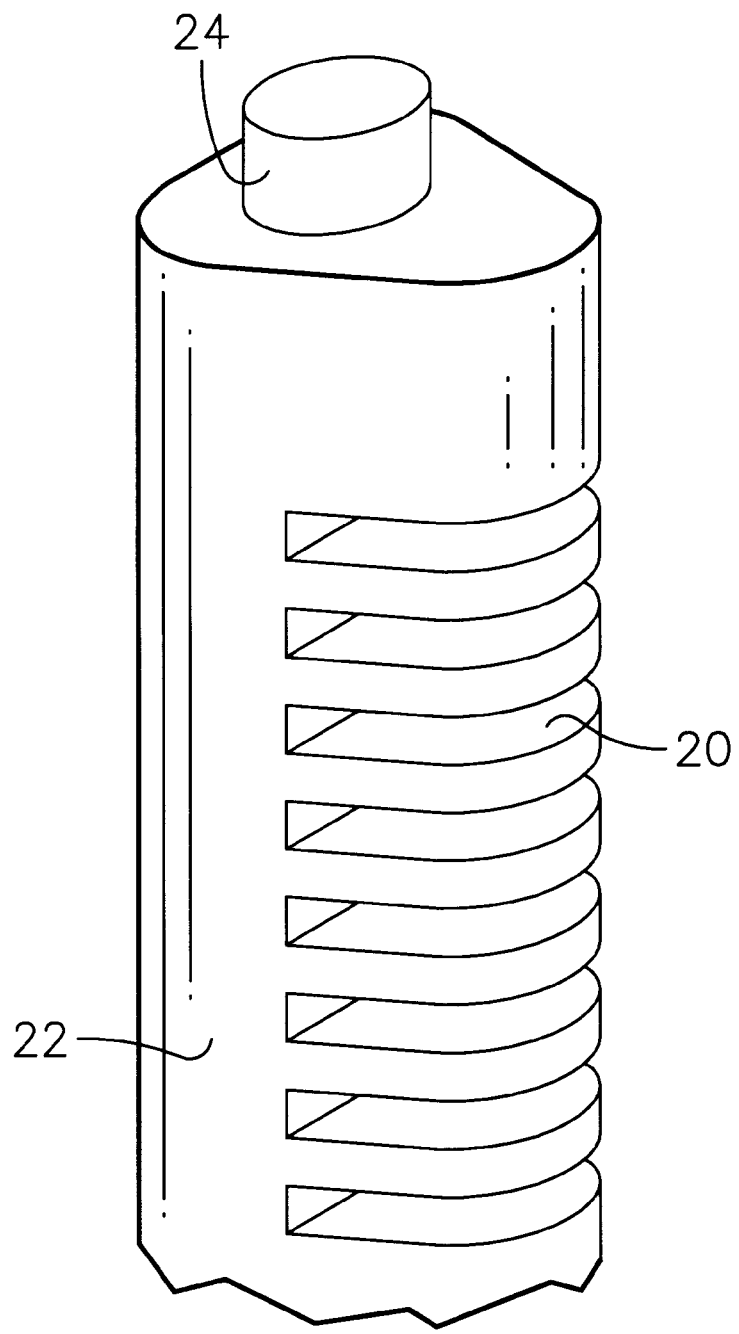
FIG. 5 illustrates a perspective view of a finished support.

A support member basic form 10 suitable for use with the method of the present invention is shown in FIG. 1. The support member basic form 10 has a substantially wedge-shaped cross-section, and can be fabricated from an inert crystalline material, such as monocrystalline or polycrystalline silicon. The illustrated basic form 10 can be produced in accordance with the method described in U.S. Ser. No. 09/292,496.

The support member basic form 10 has a front surface 12 with an angular edge 14 at the front of the wedge. The support member basic form 10 has a rear surface 16 with a pair of angular edges 18 at the back of the wedge.

The steps by which the support member basic form 10 is made into a finished support member are illustrated in FIGS. 2 through 4. As shown in FIG. 2, the first step involves machining the front and rear surfaces of the support member basic form 10 (here shown in broken line) to eliminate the angular edges 14, 18. The surfaces can be machined to radii of between 0.25" and 5.25". In the illustrated example, the front surface of the basic form 10 is machined to a radius of approximately 0.35", and the rear surface is machined to a greater radius, approximately 1.5".

The radii shown in FIG. 2 can be machined using any suitable machine tool. One example of such a machine tool is a plated diamond router or a resin bond diamond wheel with a water swivel, manufactured by National Diamond Lab. It has been found that such a machine tool achieves effective results when used in conjunction with a bit such as a custom resin bond diamond wheel available from National Diamond Lab.

Once the basic support has been machined, a plurality of wafer-retaining slots 20 are formed, as shown in FIG. 3. The slots 20 are cut along one side, here the front surface, of the support member basic form 10. The slots 20 are mutually parallel, and substantially perpendicular to a longitudinal axis A of the support member basic form (FIG. 1), and extend along a substantial portion of the length L. The slots 20 can extend either more or less than halfway through the depth D of the support member basic form, as the specific application dictates The slots 20 can be formed with any suitable diamond tool, such as a commercial diamond saw blade. One example of a suitable cutting apparatus is a 3" to 4" resin bond wheel, manufactured by National Diamond Lab. Such a slotter is particularly effective when used with a blade having diamond-coated cutting surfaces, such as a 16 grit to 400 grit blade available from National Diamond Labs. During cutting of the slots 20, it is contemplated that the slotter can be operated at speeds ranging from 5 rpm to 125,000 rpm. It has been discovered that a speed of approximately 4500 rpm is particularly effective. It is to be understood that the use of the specified cuffing apparatus, while effective, is merely illustrative. It is contemplated that alternative cutting apparatus could be employed to achieve acceptable results. Examples of such apparatus include, but are not limited to, slotters using non-diamond blades, lasers, and abrasive fluid cutting devices.

A finished support member 22 is illustrated in FIG. 5. The support member 22 is provided with at least one attachment structure 24 on each of its terminal ends 26. The attachment structure 24 is shown as a pair of cylindrical pegs. The pegs are formed by machining the ends of the support member basic form 10. This machining can be performed with any suitable cutting mechanism. One example of a suitable cutting apparatus is a vertical or horizontal milling machine, or CNC machine, manufactured by companies such as NOVA, JET, or PRESTO. The attachment structure 24 is adapted and constructed to facilitate attachment of the support member 22 to a generally planar base member, as described in copending U.S. Ser. No. 09/292,491. It is to be understood, however, that the support member could be attached to the wafer holder base in any suitable manner.

The finished support member 22 can be manufactured in any desired size. For example, the illustrated support member can be formed from a support member basic form having a width of approximately 0.475" and a length of approximately 45", with the wedge defining an angle of approximately 22° 60". The slots 20 in the illustrated embodiment have a depth of approximately 0.25", and extend approximately 43" along the length of the support member 22. The cylindrical pegs forming the attachment structure 24 extend approximately 0.6" from the ends of the support member 22, and have a diameter of approximately 0.4".

The present invention enables the fabrication of monocrystalline and polycrystalline silicon structural members for use in the manufacture of semiconductor wafers and the like, and is applicable to any large scale and/or complex fixture or part used in the processing of silicon wafers. Components using structural members in accordance with the present invention eliminate deformation during high-temperature process applications. Since the source material is the same quality as the wafers material, particulate contamination and "crystal slip" inherent with known materials such as silicon carbide is virtually eliminated. Furthermore, there is no shadowing, since the source material provides a one-to-one duplication of the physical properties and critical constants of process wafers. Monosilicon fixtures and parts provide tolerances and expected service life unachievable with those made from commonly-used materials such as quartz or silicon carbide. The present invention enables the fabrication of silicon parts and fixtures that provide advantages as the industry moves to 300 mm and larger wafer diameters.

Although the present invention has been described with reference to specific embodiments, those of skill in the art will recognize that changes may be made thereto without departing from the scope and spirit of the invention.

What is claimed is:

1. A method of fabricating a support member for a wafer processing fixture, the method comprising the following steps:
    providing an elongate support member basic form having a substantially wedge-shaped cross-section extending along a longitudinal axis and sharp edges between wedge portions of said cross-section;
    machining sides of the support member basic form to replace the sharp edges with substantially arcuate edges; and
    cutting a plurality of wafer-retaining slots along one side of the support member basic form extending along said longitudinal axis and including one of said arcuate edges.

2. A method according to claim 1, wherein the support member basic form includes a front surface including said slots and a rear surface disposed on an opposite side of said support member basic form from said front surface, with at least one sharp edge occurring on each of the surfaces, and wherein the step of machining the sides of the support member basic form comprises machining the sharp edges on the respective surfaces to radii of between 0.25" and 5.25".

3. A method according to claim 2, wherein the step of machining the sides of the support member basic form comprises machining the at least one sharp edge occurring on the rear surface to a radius of approximately 1.5".

4. A method according to claim 2, wherein the step of machining the sides of the support member basic form comprises machining the at least one sharp edge occurring on the front surface to a radius of approximately 0.35".

5. A method according to claim 1, further comprising the step of forming an attachment structure on at least one terminal end of the support member basic form, the attachment member being adapted and constructed to facilitate attachment of the support member to a base member.

6. A method according to claim 5, wherein the step of forming an attachment structure on at least one terminal end of the support member basic form comprises forming a cylindrical peg extending from at least one terminal end of the support member basic form.

7. A method according to claim 6, wherein the step of forming a cylindrical peg extending from at least one terminal end of the support member basic form comprises forming a pair of cylindrical pegs, each of which extends from a respective terminal end of the support member basic form.

8. A method according to claim 1, wherein the step of providing an elongate support member basic form comprises providing an elongate support member basic form fabricated from an inert crystalline material.

9. A method according to claim 1, wherein the step of providing an elongate support member basic form comprises providing an elongate support member basic form fabricated from silicon.

10. A method according to claim 9, wherein the step of providing an elongate support member basic form comprises providing an elongate support member basic form fabricated from polycrystalline silicon.

11. A method according to claim 9, wherein the step of providing an elongate support member basic form comprises providing an elongate support member basic form fabricated from monocrystalline silicon.

12. A method according to claim 1, wherein the support member basic form has a longitudinal axis, and the step of cutting a plurality of wafer-retaining slots along one side of the support member basic form comprises making a plurality of cuts at an angle offset from the longitudinal axis of the support member basic form.

13. A method according to claim 12, wherein the support member basic form has a predetermined depth, and the step of cutting a plurality of wafer-retaining slots along one side of the support member basic form further comprises making a plurality of cuts extending a predetermined distance through the depth of the support member basic form.

14. A method according to claim 1, wherein the step of cutting a plurality of wafer-retaining slots along one side of the support member basic form comprises using a rotary saw to make a plurality of cuts in a front surface of the support member basic form.

15. A method according to claim 14, wherein the step of cutting a plurality of wafer-retaining slots along one side of the support member basic form comprises using a rotary saw with a blade having diamond-coated cutting surfaces.

16. A method according to claim 12, wherein said cuts are substantially perpendicular to the longitudinal axis of the support member basic form.

17. A method according to claim 16, wherein said elongate support member basic form is composed of polycrystalline silicon.

18. A method according to claim 5, wherein said attachment member is configured to have a cross section corresponding to a cross section of an aperture formed in said base member.

19. A method according to claim 18, wherein said base member is a generally planar base member and said aperture extends only partially through said base member.

20. A method of fabricating support members for wafer processing fixtures, the method comprising the following steps:
    providing an elongate support member basic form including a substantially wedge-shaped cross-section having a front surface and a rear surface, with at least one sharp edge occurring on each of the surfaces;
    machining the sides of the support member basic form to render at least the front surface substantially arcuate; and
    cutting a plurality of mutually parallel wafer-retaining slots along one side of the support member basic form.

21. A method according to claim 20, wherein said machining steps renders a rear surface of said support member basic form opposite said front surface to be substantially arcuate with a radius larger than that of said front surface and said slots are formed in said front surface.

22. A method according to claim 20, wherein said support member basic form is composed of silicon.

23. A method according to claim 22, wherein said support member basic form is polycrystalline silicon.

24. A method according to claim 22, wherein said support member basic form is monocrystalline silicon.

25. A method of fabricating a support member for a wafer processing fixture, comprising the steps of:
    providing an elongate support member basic form composed of silicon and extending along a longitudinal axis;
    machining longitudinally extending sides of said support member basic form to have a substantially constant non-circular cross-section including at least three arcuate portions in at least a longitudinal portion thereof; and
    cutting a plurality of parallel wafer-retaining slots in said machined support member basic form across a first of said arcuate portions.

26. A method according to claim 25, wherein said first arcuate portion of said cross-section has a first radius of curvature and wherein a second of said arcuate portions has a second radius of curvature larger than said first radius and disposed on a side of said machined support member basic form opposite said first arcuate portion.

27. A method of fabricating support members for wafer processing fixtures, comprising the steps of:
    providing a support member extending along an axis including
        two substantially symmetric planar sides inclined with respect to each other and converging at a line extending parallel to said axis outside of said member,
        a front side connecting on a side of said member towards said line, and
        a rear side positioned on a side of said member opposite said line; and
    cutting slots in said front side perpendicular to said axis.

28. A method according to claim 27, wherein said front side has a smaller length perpendicular to said axis than does said rear side.

29. A method according to claim 27, wherein said slots are cut through portions of said two planar sides.

30. A method according to claim 27, wherein a plurality of said slots are equally spaced and sized to receive silicon wafers.

31. A method according to claim 27, further comprising joining opposite ends of a plurality of said support members cut with said slots to respective ones of two bases.

* * * * *